(12) United States Patent
Tian et al.

(10) Patent No.: US 7,020,276 B1
(45) Date of Patent: Mar. 28, 2006

(54) FREQUENCY SENSITIVE INDUCTANCE DEVICE IN POTS SPLITTER DESIGN

(75) Inventors: Wei Tian, Plano, TX (US); Harley J. Staber, Coppell, TX (US)

(73) Assignee: Corning Cable Systems LLC, Hickory, NC (US)

( * ) Notice: Subject to any disclaimer, the term of this patent is extended or adjusted under 35 U.S.C. 154(b) by 0 days.

(21) Appl. No.: 09/483,756

(22) Filed: Jan. 14, 2000

(51) Int. Cl.
*H04M 1/00* (2006.01)
*H04M 9/00* (2006.01)
*H04M 9/08* (2006.01)

(52) U.S. Cl. .................. 379/402; 379/93.1; 379/93.06; 379/399.01

(58) Field of Classification Search ............. 379/93.05, 379/93.09, 399.01, 402, 404, 412, 413, 413.02, 379/398, 93.01
See application file for complete search history.

(56) References Cited

U.S. PATENT DOCUMENTS

| | | | | |
|---|---|---|---|---|
| 5,848,150 A | * | 12/1998 | Bingel | .................... 379/399.01 |
| 6,137,880 A | * | 10/2000 | Bella | |
| 6,567,519 B1 | * | 5/2003 | Ham | .......................... 379/372 |

* cited by examiner

*Primary Examiner*—Duc Nguyen

(57) ABSTRACT

POTS splitter design which incorporates a low-pass filter which improves the voice-band return loss characteristics without sacrificing performance with regard to the voice-band insertion loss or the ADSL-band attenuation distortion. This is accomplished by replacing the inductor of the conventional POTS splitter low-pass circuit with a parallel-connected inductor and resistor.

12 Claims, 2 Drawing Sheets

FREQUENCY SENSITIVE INDUCTANCE DEVICE IN POTS SPLITTER DESIGN

BACKGROUND

The present invention generally relates to improved telecommunications systems and in particular to an improved digital/POTS telecommunications system. Still more particularly, the present invention relates to an improved digital/POTS splitter design.

The basic functions and requirements for POTS Splitter are well defined in TIE1.4/98-007R5, Annex E, which is hereby incorporated by reference. The POTS splitter is used to split "Plain Old Telephone System" (POTS) voiceband signals from Asymmetric Digital Subscriber Line (ADSL) signals traveling over the same telephone line.

In conventional systems, the POTS splitter is designed as a LC low-pass filter. With regard to ADSL signals, a low-pass filter provides protection from the high-frequency transients and impedance effects that occur during POTS operation, e.g., ringing transients, ring trip transients, and off-hook transients and impedance changes. With regard to POTS voice band service, the low-pass filter provides protection from ADSL signals which may impact through non-linear or other effects remote devices, e.g., handset, fax, voice band modem, etc., and central office operation.

TIE1.4/98-007R5, Annex E specifies acceptable ranges for insertion loss in the voice band, return loss in the voice band, and attenuation distortion in the ADSL band, among other requirements. These requirements make the common POTS splitter design, which incorporates a differential pair of conventional LC low-pass filter circuits, less than ideal for this purpose. Because the inductor used in a conventional LC low-pass filter circuit is frequency independent in the voice range, it is very hard to meet each of the requirements above at same time. It would therefore be desirable to provide an improved low-pass filter circuit for a POTS splitter which optimizes the TIE1.4 requirements.

SUMMARY OF THE INVENTION

The POTS splitter design of the preferred embodiment incorporates a low-pass filter which improves the voice-band loss characteristics without sacrificing performance with regard to the voice-band insertion loss or the ADSL-band attenuation distortion. This is accomplished by replacing the inductor of the conventional POTS splitter low-pass circuit with a parallel-connected inductor and resistor.

DETAILED DESCRIPTION OF THE PREFERRED EMBODIMENT

Figure 1:
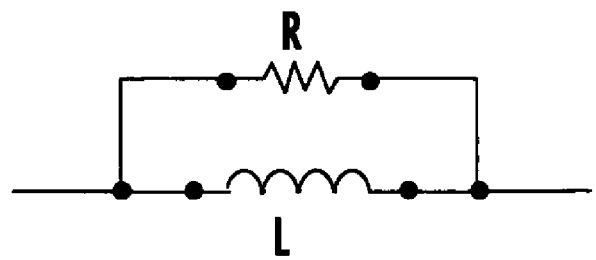
FIG. 1 depicts a basic RL inductor circuit in accordance with a preferred embodiment of the present invention.

With reference now to the figures, and in particular with reference to FIG. 1, there is provided an improved low-pass filter circuit for a POTS splitter, which uses a parallel-connected resistor R and inductor L.

This invention is used to get lower inductive impedance at high frequency (3 KHz–4 KHz), so a better return loss is obtained without interfering with other performance characteristics.

FIG. 1 shows the basic structure of this invention. The total impedance of this device is (Equation 1):

$$z_{(w)} = \frac{jwRL}{R + jwL} = \frac{jwR^2L + w^2L^2R}{R^2 + (wl)^2} = R\frac{1}{1+(wl)^2} + jwL\frac{1}{1+\left(\frac{wL}{R}\right)^2}$$

The imaginary part if the impedance is (Equation 2):

$$\text{Im}(z_{(m)}) = wl\frac{1}{1+\left(\frac{wL}{R}\right)^2}$$

As the frequency goes high, $$\left(\frac{wL}{R}\right)^2$$

goes high, and the inductance of this device, $$L\frac{1}{1+\left(\frac{wl}{R}\right)^2},$$

goes low due to the addition of the resistor.

Figure 2:
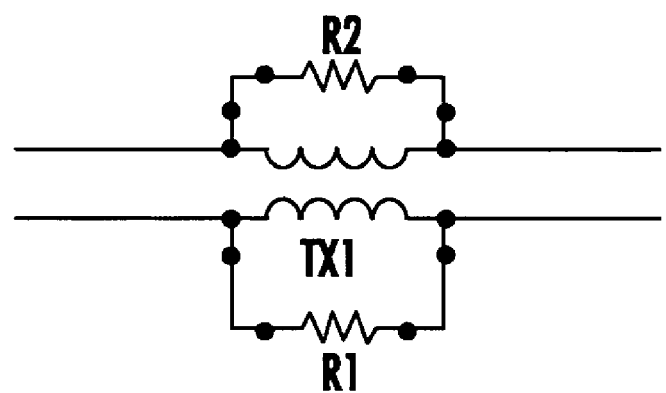
FIG. 2 depicts a differential-mode RL inductor pair in accordance with a preferred embodiment of the present invention.

FIG. 2 shows a POTS splitter device, in accordance with the preferred embodiment, which incorporates a low-pass filter with the improved inductor circuit described above. In the POTS splitter, transformers are used as differential mode inductors. In FIG. 2, the transformer TX1 is shown with each inductive coil connected in parallel with a respective resistor R1 and R2. The impedance of each side of transformer TX1 is described by Equations 1 and 2, above; the transformation from FIG. 1 to FIG. 2 is:

R1=R2=R/2

L1=L2=L/4 where L1 and L2 are the inductance of each transformer winding. Of course, this is merely exemplary; according to different requirements for the central office and remote end POTS splitters, the value of R and L may change in different designs.

Figure 3:
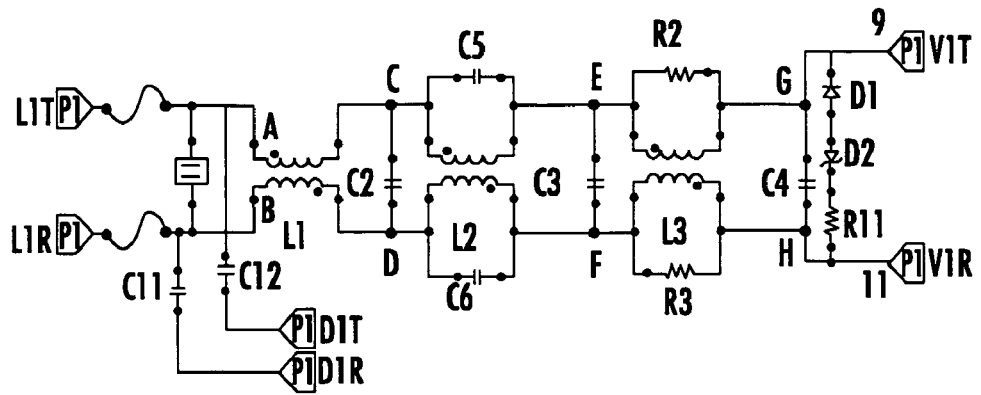
FIG. 3 depicts a central-office POTS splitter employing a low-pass filter circuit in accordance with a preferred embodiment of the present invention.
Figure 4:
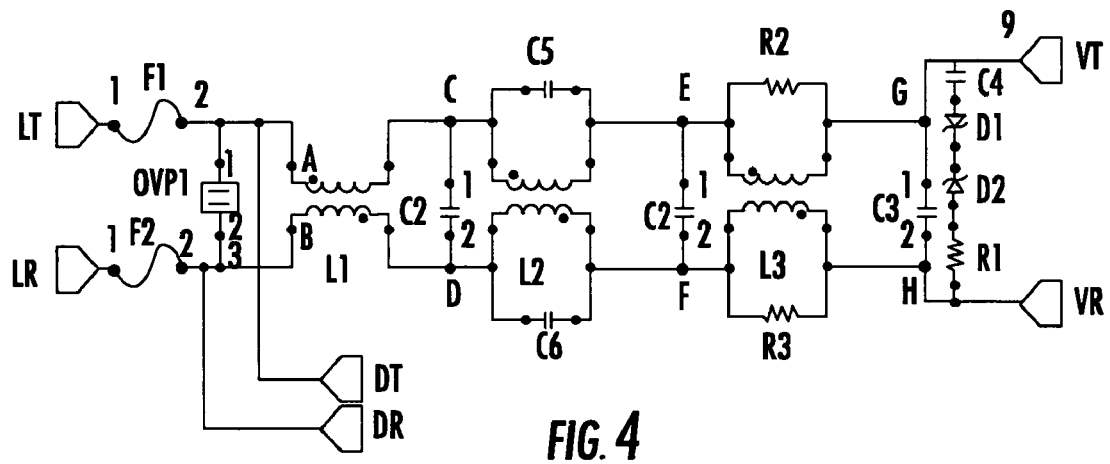
FIG. 4 is depicts a remote-end POTS splitter employing a low-pass filter circuit in accordance with a preferred embodiment of the present invention.

FIGS. 3 and 4, respectively, show POTS splitter designs, using frequency-sensitive inductance devices in accordance with the preferred embodiment, of a central office POTS splitter and a remote end POTS splitter. In these figures, the frequency sensitive device consists of L3, R2, and R3. The low-pass filter is therefore comprised of L3, R2, R3, and C4 in FIG. 3, and L3, R2, R3, and C3 in FIG. 4. Other parts of the circuit will be understood by those of skill in the art as a conventional POTS splitter circuit.

For purposes of this discussion, the conventional circuit comprised by L1 and C2 in FIG. 3, and by L1 and C1 in FIG. 4, will be refereed to as "stage 1" of each of these figures. Similarly, the conventional circuit comprised by L2, C5, C6, and C3 in FIG. 3, and by L2, C5, C6, and C2 in FIG. 4, will be referred to as "stage 2" of each of these figures. Finally, "stage 3" will reference the frequency-sensitive circuit of the preferred embodiment, which comprises L3, R2, R3, and C4 in FIG. 3, and by L3, R2, R3, and C3 in FIG. 4.

It will then be clear that, in FIGS. 3 and 4, nodes A and B form the inputs to stage 1, and nodes C and D are both the outputs of stage 1 and the inputs of stage 2. Nodes E and F are both the outputs of stage 2 and the inputs of stage 3, and nodes G and H are the outputs of stage 3.

In normal operation, a combined voice-band and ADSL signal is received by the splitter circuits at inputs L1T and L1R of FIG. 3, and inputs LT and LR of FIG. 4. The ADSL signal is output at outputs D1T and D1R of FIG. 3, and outputs DT and DR of FIG. 4. The ADSL signal is filtered from the voiceband signal, and the voiceband signal is output at outputs V1T and V1R of FIG. 3, and outputs VT and VR of FIG. 4.

According to the preferred embodiment, the values of the components of FIG. 3 are as follows:

| | |
|---|---|
| L1 | 20 mH (±8%) |
| L2, L3 | 12 mH (±8%) |
| C11, C12 | 120 nF 400 V (±10%) |
| C2 | 10 nF 400 V (±5%) |
| C3 | 10 nF 400 V (±5%) |
| C4 | 47 nF 400 V (±5%) |
| C5, C6 | 4.7 nF 400 V (±5%) |
| R2, R3 | 200 |

Also according to the preferred embodiment, the values of the components of FIG. 4 are as follows:

| | |
|---|---|
| L1 | 20 mH (±8%) |
| L2, L3 | 12 mH (±8%) |
| C1 | 33 nF 400 V (±5%) |
| C2 | 22 nF 400 V (±5%) |
| C3 | 47 nF 400 V (±5%) |
| C4 | 0.47 nF 400 V (±5%) |
| C5, C6 | 4.7 nF 400 V (±5%) |
| R1 | 33.1K 1% .25 W |
| R2, R3 | 100 10% .25 W |

Of course, while the component values of the preferred embodiment are shown above, those of skill in the art will recognize that these values can be varied according to specific system requirements. In particular, in FIG. 3 and FIG. 4, the preferred frequency sensitive device that consists of L3, R2, and R3, from stage 3, can be used to replace other conventional transformer/filter circuits, e.g., the C5, C6, L2 circuit of stage 2. This means that a frequency-sensitive circuit as in stage 3 may also appear as the first or second stage.

Further, the position of the frequency-sensitive inductive device within the POTS splitter will vary the overall performance characteristics of the splitter. For example, in FIG. 4 above, the stage 3 circuit can be switched with the stage 2 circuit, so that their order is reversed, according to the requirements of the system in which the system is to be installed.

The preferred embodiment, by incorporating this frequency-sensitive inductive device, will simultaneously minimize the magnitude of ripple in the high frequency band (3 K–4 KHz) and maximize the return loss at high frequency band (3 K–4 KHz), without negatively affecting, to any substantial degree, the attenuation distortion of the ADSL band.

While the invention has been particularly shown and described with reference to a preferred embodiment, it will be understood by those skilled in the art that various changes in form and detail may be made therein without departing from the spirit and scope of the invention.

The invention claimed is:

1. A frequency-sensitive electrical circuit, comprising:
   first and second inputs;
   at least one transformer circuit having a first winding connected to the first input and a second winding connected to the second input;
   a first load connected in parallel to the first winding;
   a second load connected in parallel to the second winding;
   first and second outputs connected to the first and second windings, respectively;
   a capacitor connected between the first and second outputs;
   third and fourth inputs;
   third and fourth outputs;
   a parallel-connected third winding and second capacitor, connected between the third input and the third output;
   a parallel-connected fourth winding and third capacitor, connected between the fourth input and the fourth output, the third winding and the fourth winding being inductively coupled; and
   a fourth capacitor connected between the third and fourth outputs;
   wherein the third and fourth outputs from the first and second inputs, respectively.

2. The circuit of claim 1, wherein a signal carrying both voice and data information is received at the first and second inputs.

3. The circuit of claim 1, wherein the circuit filters a lower-frequency portion of a signal received at the first and second inputs.

4. The circuit of claim 1, wherein the circuit reduces the distortion of a signal received at the first and second inputs and delivered at the first and second outputs.

5. A frequency-sensitive electrical circuit, comprising:
   a first stage having first and second inputs and first and second outputs, the first stage comprising
      a parallel-connected first inductor and first resistor, connected between the first input and first output of the first stage,
      a parallel-connected second inductor and second resistor, connected between the second input and second output of the first stage, the first and second inductors being inductively coupled, and
      a first capacitor connected between the first and second outputs of the first stage; and
   a second stage having first and second inputs and first and second outputs, the second stage comprising
      a parallel-connected third inductor and second capacitor, connected between the first input and first output of the second stage,
      a parallel-connected fourth inductor and third capacitor, connected between the second input and second output of the second stage, the third and fourth inductors being inductively coupled, and a fourth capacitor connected between the first and second outputs of the second stage, wherein the first and second outputs of the second stage form the first and second inputs of the first stage, respectively.

6. A frequency-sensitive electrical circuit, comprising:

a first stage having first and second inputs and first and second outputs, the first stage comprising a parallel-connected first inductor and first resistor, connected between the first input and first output of the first stage, a parallel-connected second inductor and second resistor, connected between the second input and second output of the first stage, the first and second inductors being inductively coupled, and a first capacitor connected between the first and second outputs of the first stage; and a second stage having first and second inputs and first and second outputs, the second stage comprising a third inductor connected between the first input and first output of the second stage, a fourth inductor connected between the second input and second output of the second stage, the third and fourth inductors being inductively coupled, and a second capacitor connected between the first and second outputs of the second stage, wherein the first and second outputs of the second stage form the first and second inputs of the first stage, respectively.

7. The circuit of claim 5, wherein a signal carrying both voice and data information is received at the first and second inputs of the first stage.

8. The circuit of claim 5, wherein the circuit filters a lower-frequency portion of a signal received at the first and second inputs of the first stage.

9. The circuit of claim 5, wherein the circuit reduces the distortion of a signal received at the first and second inputs of the first stage and delivered at the first and second outputs of the first stage.

10. The circuit of claim 6, wherein a signal carrying both voice and data information is received at the first and second inputs of the first stage.

11. The circuit of claim 6, wherein the circuit filters a lower-frequency portion of a signal received at the first and second inputs of the first stage.

12. The circuit of claim 6, wherein the circuit reduces the distortion of a signal received at the first and second inputs of the first stage and delivered at the first and second outputs of the first stage.

* * * * *